United States Patent
Zhang

(10) Patent No.: US 6,825,784 B1
(45) Date of Patent: Nov. 30, 2004

(54) DITHERING METHOD FOR SIGMA-DELTA ANALOG-TO-DIGITAL CONVERTERS

(75) Inventor: Weibiao Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/782,240

(22) Filed: Feb. 18, 2004

(51) Int. Cl.[7] .............................................. H03M 1/20
(52) U.S. Cl. ...................................... 341/131; 341/155
(58) Field of Search ................................. 341/131, 155

(56) References Cited

U.S. PATENT DOCUMENTS 6,049,299 A * 4/2000 Lunacek et al. ............. 341/131
6,331,831 B1 * 12/2001 Cvetkovic et al. .......... 341/131

OTHER PUBLICATIONS

"A 14–Bit 80–kHz Sigma–Delta A/D Converter: Modeling, Design, and Performance Evaluation " Norsworthy et al, IEEE Journal of Solid–State Circuits vol. 24 No. 2, Apr., 1989, pp 256–266
Delta–Sigma Data Converters Theory, Design and Simulation, Norsworthy et al, IEEE Circuits & Systems Society, pp 98–108 (no date).
"Effective Dithering of Sigma–Delta Modulators", Norsworthy, IEEE 1992, pp 1304–1307.
"A 102–dB Spurious–Free DR EΔ ADC Using a Dynamic Dither Scheme" Gomez, IEEE Transactions on Circuits & Systems, vol. 47, Jun. 2000, pp 531–535.

* cited by examiner

Primary Examiner—Brian Young
(74) Attorney, Agent, or Firm—April M. Mosby; Wade James Brady, III; Frederick J. Telecky, Jr.

(57) ABSTRACT

A Sigma-Delta Analog-to-Digital Converter (ADC) having efficient dithering that removes the idle channel tones of the sigma-delta converter is disclosed herein. These idle channel tones are reduced or removed by stretching the threshold window of the multi-level quantizer. A dithering sequence is added by stretching the thresholds window randomly. The randomly stretched window destructs the periodicity of sigma-delta ADC modulator's output sequence and, thus, removes the idle channel tones. Compared with conventional methods, the Sigma-Delta ADC in accordance with the present invention has less SNR penalty and is simple to implement. Moreover, the sigma-delta ADC in accordance with the present invention has a higher allowed input dynamic range and higher signal-to-noise-plus-distortion-ratio (SNDR) than conventional modulator dithering schemes.

9 Claims, 4 Drawing Sheets ( Lower curve: dither in Figure 3, upper curve: new dither in Figure 4)

US 6,825,784 B1

DITHERING METHOD FOR SIGMA-DELTA ANALOG-TO-DIGITAL CONVERTERS

FIELD OF THE INVENTION

The present invention relates to sigma-delta Analog-to-Digital Converters (ADCs), and, more particularly, to a sigma-delta ADC having efficient dithering.

BACKGROUND OF THE INVENTION

Most sigma-delta modulators include periodic idle channel noise. Even after lowpass filtering, the peak amplitudes of the periodic idle channel noise can be relatively high, even though the RMS power level of the noise is low. Accordingly, this noise gives rise to an annoying sound for the human ear in any audio application; yet, this same idle channel noise may not interfere with a data acquisition system using the same modulator.

An example of a second-order sigma-delta modulator architecture susceptible to having idle channel noise is shown in FIG. 1. As shown, modulator 10 includes two integrators, 16 and 22, and two negative feedback loops, wherein the first feedback loop includes a digital-to-analog converter (DAC) 26. Summers, 12 and 20, couple these two negative feedback loops to the feed forward portion of modulator 10. Coefficients $k_1$ and $k_2$ supplied by respective multipliers, 14 and 18, represent forwarding coefficients, while coefficients $k_{f1}$ and $k_{f2}$ supplied by respective multipliers, 28 and 30, represent feedback coefficients. Quantizer 24 can be a two-level quantizer having one bit or a multi-level quantizer having three or more bits. When the input x(n) is a small DC signal or some small DC offset and the channel is idle, the output y(n) of the sigma-delta modulator will exhibit a series of digital codes having a low frequency pattern proportional to the DC offset and the sampling clock. As explained previously, in audio applications where there is a DC offset in addition to a small frequency signal, the idle channel tones could lead to an unpleasant sound.

Conventional dithering methods to whiten or decorrelate the idle channel tones include but are not limited to, (1) adding an out-of-band sine or square wave; (2) adding a DC offset to the input of the modulator; (3) adding a small amount of white noise to the input; (4) adding a small-amplitude periodic pulse train; and (5) starting the integrators with irrational values. These techniques are either too complicated to implement or are not effective.

An effective dithering method is to add dither in such a way that the dither transfer function is the same as the quantization noise transfer function. This generalized dither is shown in FIG. 2a. As shown, input x(n) represents the input signal that is fed to a feed forward Z transfer function G(z) 104. Through summer 106, a dither input d(n) is added to the resultant signal of the feed forward Z transfer function G(z) 104. Quantizer 108 receives the result to provide an output y(n). Output y(n) is fed back through a feedback transfer function H(z) 112 and the output of transfer function H(z) 112 is added to the input using summer 102. An error function e(n) is provided through the subtraction of the signal after summer 106 from the output signal y(n).

In the alternative, as shown in FIG. 2b, the dither input d(n) can be added to the input of quantizer 120 directly or added to the input of modulator 120 after a pre-filter 122. As shown, the input x(n) is summed with the output of the pre-filter 122 using adder 124. The feed forward Z transfer function G(z) couples to receive sum and provides its result to quantizer 128. The output y(n) is fed back to feedback transfer function H(z) 132. Adder 124 sums the result to feed forward portion of modulator 120. Adding dither to the input of the quantizer is not simple. An equivalent representation is to shift the decision thresholds of the quantizer.

Conventionally a uniformly distributed signal is added in front of the quantizer so that the x and y signals maintain the same transfer function. Given the hypothetical when an input signal is fixed having a small DC offset, the idle channel tone can repeat itself for several cycles; thereby creating a periodic idle channel tone. When, however, a dithering sequence is added, the periodic idle channel tone is destroyed. Thus, the resultant signal will look more like a random signal where the power is reduced and spread over the frequencies.

In general, an idle channel tone is proportional to the input DC offset. Thus, if there is a fixed DC offset there is a fixed frequency. Once, however, dithering is introduced, the output will a decreased power for that fixed frequency and the other frequencies may increase in power.

FIG. 3 illustrates a known method and apparatus for adding a dither signal to a 3-level quantizer. Specifically, FIG. 3 gives the details of how the dithering signal may couple into the quantizer 108 as shown in FIG. 2a. The input signal $V_{in}$ comes from the feed forward Z transfer function G(z) as is shown in FIG. 2a. Conventionally, the first threshold voltage $V_{th0}$ is the negative value of the second threshold voltage $V_{th1}$ where $V_{th0}=-V_{th}$, $V_{th1}=V_{th}$. The first and second threshold voltages, $V_{th0}$ and $V_{th1}$, are received by the inverted input of each comparator, 136 and 134, respectively. Signals $B_0$ and $B_1$, represent the output signal y(n) of FIG. 2a. As shown, adder 132 adds a pseudo-random series dither d(n) to the quantizer input represented by $V_{in}$, wherein the quantizer is implemented using adder 132 and comparators, 134 and 136. When the inputs ($V_{in}$+d(n)) of comparators, 134 and 136, are larger than threshold voltage $V_{th}$, the output nodes $B_1B_0$ are both high or "11". As shown in FIG. 2, when the digital signal y(n) is fed back to the transfer function H(z), it is converted to an analog signal proportional to a reference voltage $V_{ref}$. This reference voltage $V_{ref}$ is fed back to the integrators coupled as shown in FIGS. 1 and 2. When the inputs ($V_{in}$+d(n)) of comparators, 134 and 136, are less than or equal to threshold voltage $V_{th}$ and greater than the negative value of threshold voltage $-V_{th}$, the output nodes $B_1B_0$ are both low or "00". Thereby a value of "0" is fed back to the integrators. When the input ($V_{in}$+d(n)) of the comparators, 134 and 136, are less than the negative value of threshold voltage $-V_{th}$ the output nodes $B_1B_0$ are both high or "11". As a result, the negative value of reference voltage $-V_{ref}$ is fed back to the integrators. The 0 dBFS input to the converter, in this case is the transfer function H(z), is either a positive or negative value of the reference voltage $+/-V_{ref}$.

Without a dither signal where d(n)=0 for all n, the decision threshold window for the quantizer is $(-V_{th}, V_{th})$. With the dither signal d(n), the window is shifted to $(-V_{th}-d(n), V_{th}-d(n))$. When the dither signal d(n) is a pseudorandom series, the window shifts randomly and, thereby, generates a decorrelated output sequence. Thus, the periodicity of the output series y(n) is destroyed and the idle channel tones are removed.

The dithering d(n) amplitude, however, must be large enough to remove the idle channel tones. For example, for a 1-bit quantizer, the ratio of the peak-to-peak range of the dither to the quantizer interval $\delta/\Delta$ must be greater than 0.5, where $\delta$ is the peak-to-peak range of the dither and $\Delta$ is the quantizer interval. The dynamic range is degraded by 5 dB when dither peak-to-peak range δ is equal to quantizer interval Δ.

For a high input signal range, however, there still exists penalties wherein the signal to noise ratio decreases when there is a high input signal. Thus, a need exists for a more efficient dithering method that removes idle channel noise from a sigma-delta modulator.

SUMMARY OF THE INVENTION

To address the above-discussed deficiencies of sigma-delta modulators, the present invention teaches a sigma-delta modulator having a more efficient dithering method that removes idle channel noise. This sigma-delta modulator and novel dithering method for removing the idle channel tones of sigma-delta analog-to-digital converters (ADC) includes adding dither by stretching the threshold windows randomly. The randomly stretched window destructs the periodicity of sigma-delta ADC modulator's output sequence and, thereby, removes the idle channel tones.

The sigma-delta modulator in accordance with the present invention includes a first adder, a feed forward transfer function G(z), a quantizer circuit and a feed back transfer function H(z). The quantizer circuit includes a second adder, a first dither signal generator, a first comparator, a third adder, a second dither signal generator, and a second comparator. The second adder receives the first threshold and adds the dither signal provided by the first dither signal generator to this first threshold. The first comparator compares the input signal with the sum generated by the second adder. The third adder receives the second threshold and subtracts the second dither signal generated by the second dither signal generator from the second threshold. The second comparator compares the input signal with the result generated by the third adder.

The sigma-delta modulator in accordance with the present invention does not necessarily have to be one of a first order. It may be comprised more than one stage.

Advantages of this design include but are not limited to sigma-delta modulator having a more efficient dithering method that removes idle channel noise from a sigma-delta modulator. Compared to conventional dithering techniques that add random noise to the input of the quantizer, this novel dithering technique and apparatus has a higher allowed input dynamic range and higher signal-to-noise-plus-distortion-ratio (SNDR).

These and other features and advantages of the present invention will be understood upon consideration of the following detailed description of the invention and the accompanying drawings.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 3 shows an implemented of the dither added in front of the quantizer 108 of FIG. 2a;

DETAILED DESCRIPTION OF THE PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

Figure 4:
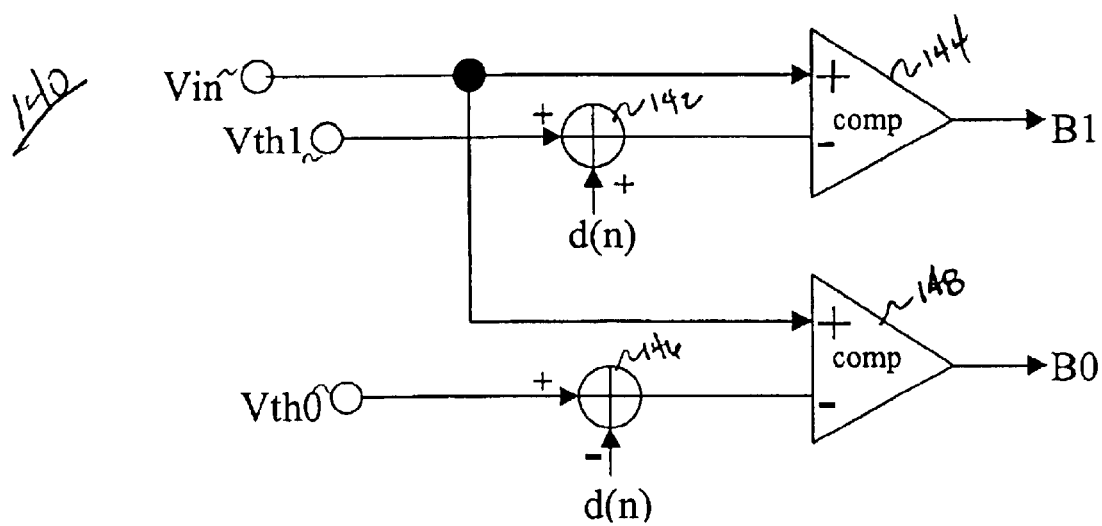
FIG. 4 illustrates a quantizer having a dither signal generator in accordance with the present invention.

FIG. 4 illustrates a method and apparatus for adding a dither signal to a 3-level quantizer 140 in accordance with the present invention. The threshold window in accordance with the present invention stretches as opposed to shifts with regards to the conventional modulator. As shown, dither is added in quantizer 140 and has same transfer function as quantization noise transfer function. Specifically, FIG. 4 gives the details of how the dithering signal may couple into the quantizer 108 as shown in FIG. 2a. The input signal $V_{in}$ comes from the feed forward Z transfer function G(z) as is shown in FIG. 2a. Conventionally, the first threshold voltage $V_{th0}$ is the negative value of the second threshold voltage $V_{th1}$ where $V_{th0}=-V_{th}$, $V_{th1}=V_{th}$. Adders 146 and 142 couple to receive the first and second threshold voltages, $V_{th0}$ and $V_{th1}$. In addition, adders, 146 and 142, couple to receive from the dither signal generator (not shown) a pseudo-random series dither signal d(n). This dither signal d(n) is added to the first adder 142, while the dither signal d(n) is subtracted from the second adder 146. The resultant signal from adders 146 and 142 are received by the inverted input of each comparator, 148 and 144, respectively. Signals $B_0$ and $B_1$ represent the output signal y(n) of FIG. 2a. As shown, adders, 146 and 142, adds a pseudo-random series dither d(n) to the quantizer input represented by $V_{in}$, wherein the quantizer is implemented using adders, 146 and 142, and comparators, 144 and 148.

Figure 1:
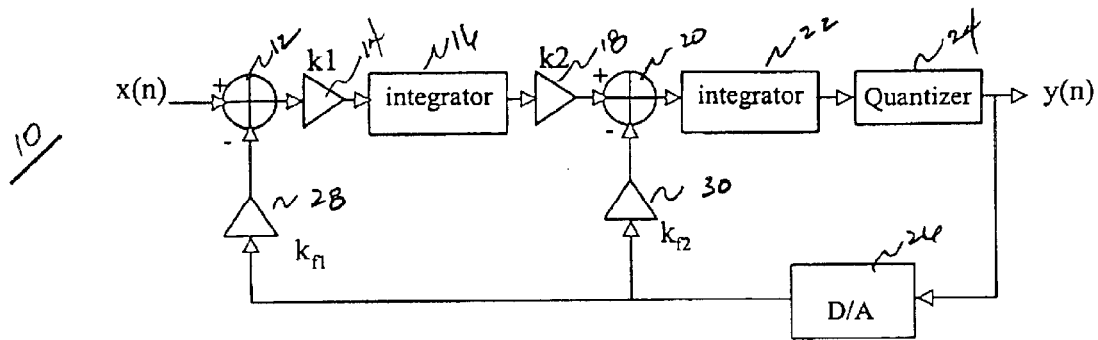
FIG. 1 illustrates a known second order Sigma-delta ADC.
Figure 2:
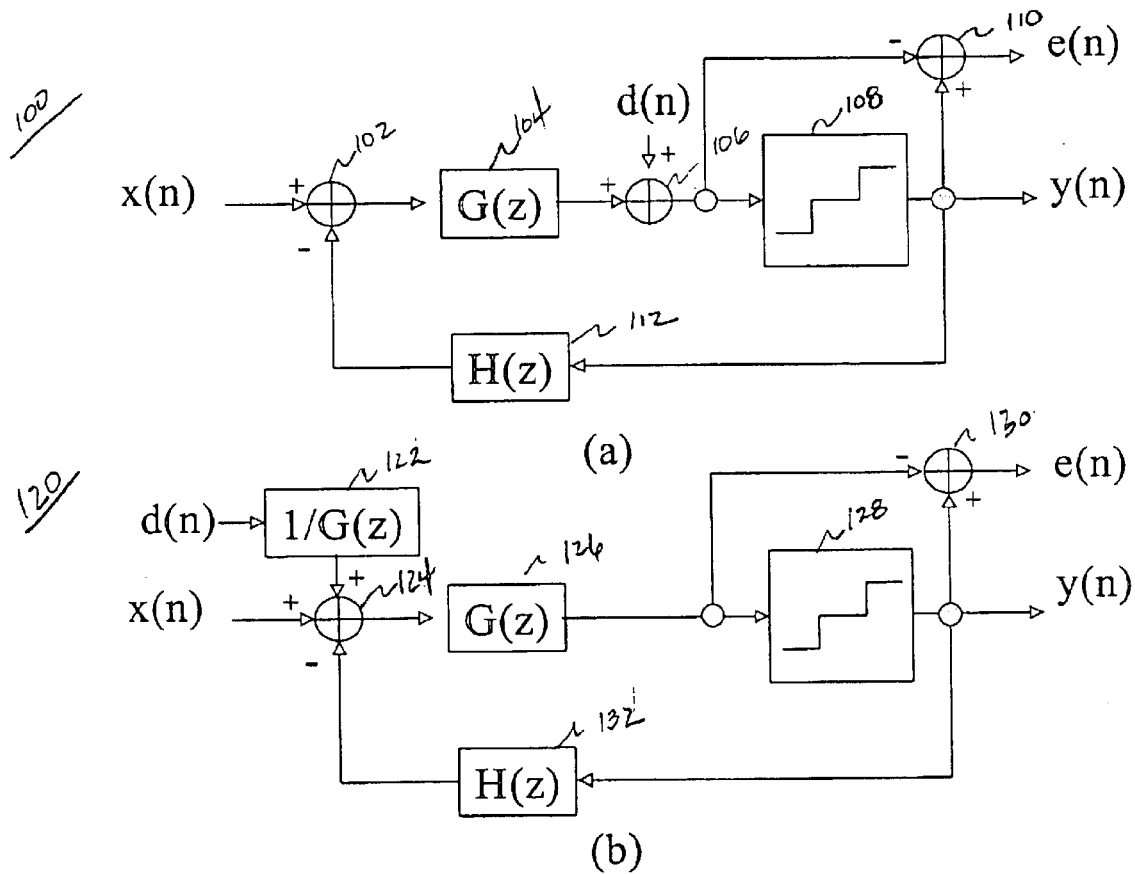
FIGS. 2a and 2b display a known first-order Sigma-delta ADC having a dither signal generator, wherein the dither signal is added after and before the feed forward transfer function G(z), respectively.

When the inputs of comparators, 144 and 148, are larger than threshold voltage $V_{th}$, the output nodes $B_1B_0$ are both high or "11". As shown in FIG. 2, when the digital signal y(n) is fed back to the transfer function H(z), it is converted to an analog signal proportional to a reference voltage $V_{ref}$. This reference voltage $V_{ref}$ is fed back to the integrators coupled as shown in FIGS. 1 and 2. When the inputs of comparators, 144 and 148, are less than or equal to threshold voltage $V_{th}$ and greater than the negative value of threshold voltage $-V_{th}$, the output nodes $B_1B_0$ are both low or "00". Thereby a value of "0" is fed back to the integrators. When the input of the comparators, 144 and 148, are less than the negative value of threshold voltage $-V_{th}$, the output nodes $B_1B_0$ are both high or "11". As a result, the negative value of reference voltage $-V_{ref}$ is fed back to the integrators. The full swing of the data converter in this case is either a positive or negative value of the reference voltage $+/-V_{ref}$.

Figure 3:
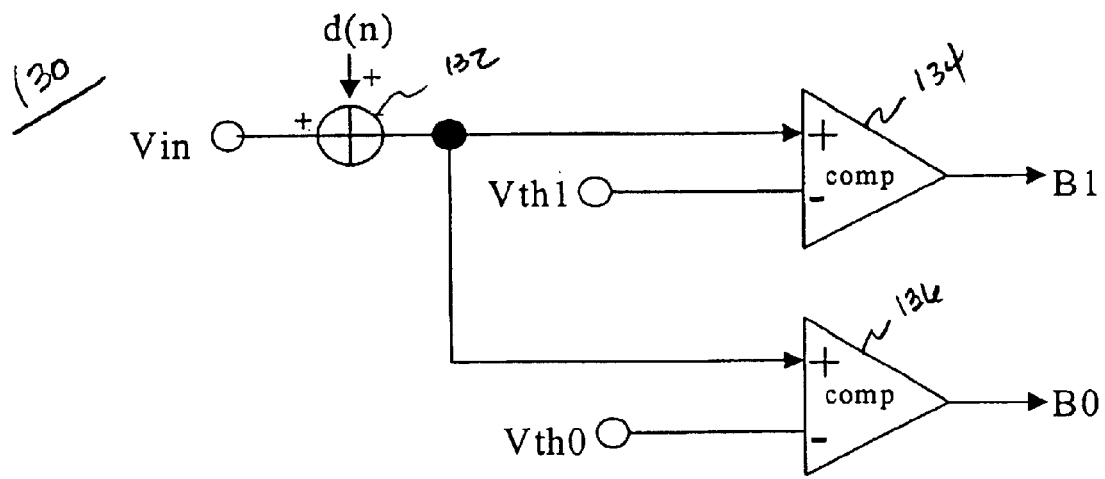

Table 1 shows the difference between the dither provided by the known quantizer 130 of FIG. 3 and the quantizer 140 in accordance with the present invention as shown in FIG. 4. The dither in FIG. 3 have a fixed threshold interval ($2*V_{th}$) regardless of the value of the dither signal d[n], while the dither provided by the novel design of FIG. 4 has a varied threshold window width depending on the dither sequence d[n]. The window is expanding when the dither sequence d[n]>0 and shrinking when the dither sequence d[n]<0. From the linear approximation point of view, the quantizer gain changes with the dither sequence d[n]. Care should be taken that the system in which the modulator is placed is stable when the quantizer gain is changed dynamically.

TABLE 1

Dither comparison for a 3-level quantizer

|  | Dither in FIG. 3 | Dither in FIG. 4 |
|---|---|---|
| Threshold window | ($V_{th1}-V_{th0}$) | ($V_{th1}-V_{th0} + 2d(n)$) |

Figure 5:
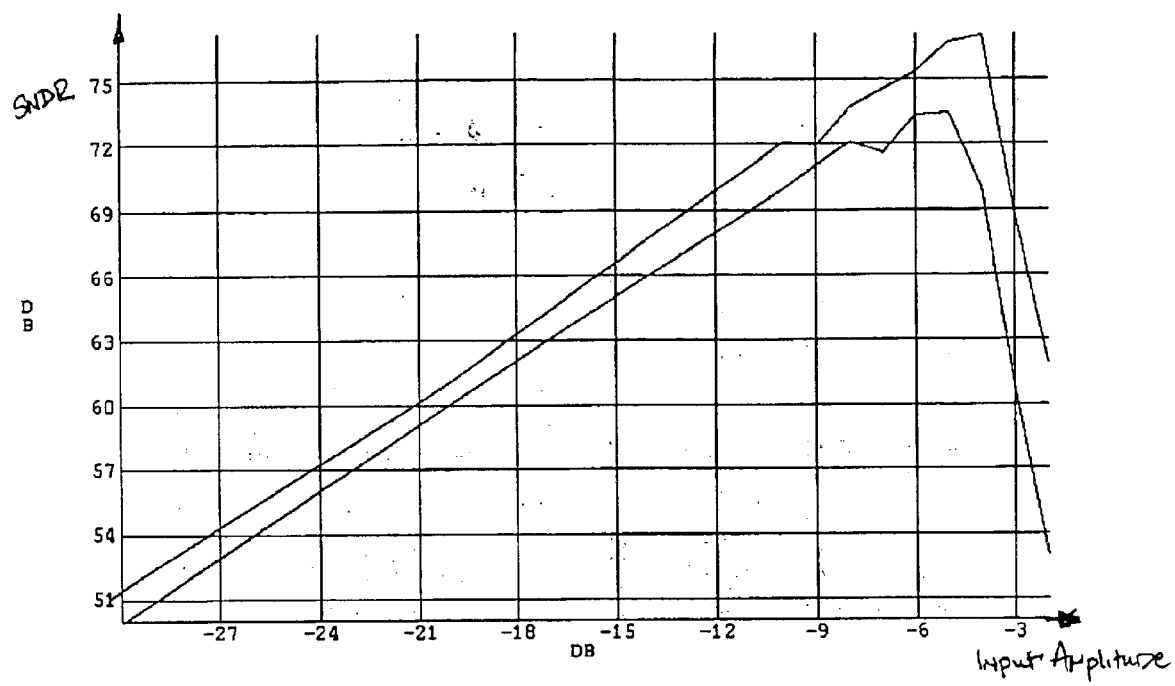
FIG. 5 illustrates a graph comparing the input amplitude with respect to the Signal-to-Noise and Distortion Ration (SNDR) for the quantizer of FIG. 3 and FIG. 4, which represents the known dithering technique and that dithering technique in accordance with the present invention.

FIG. 5 shows the simulated SNDR (Signal-to-Noise-plus-Distortion-Ratio) versus the input amplitude of each of the quantizers from FIGS. 3 and 4 respectively. Each dither sequence is applied to a typical single-stage second-order sigma-delta converter having a dithered 3-level quantizer. During simulation, both dithers removed the idle channel tones greatly since the results of the audible hearing test did not produce audible tones in the output code series of the digital filter following the modulator (not shown). The x-axis represents the input sweep relative to full scale (0 dBFs). The y-axis represents the SNDR of the final converter output after a digital filter following the ADC modulator. The upper curve represents the results of the dither sequence as applied in FIG. 4. The lower curve represents the results of the dither sequence as applied in FIG. 3. While the dither energy for both dither sequence is the same, it is obvious that the modulator with having the novel dither sequence implementation has a better SNDR performance where the input amplitude is close to the full scale in between the range of −6 dB to −3 dB. As shown, whereas the known window remains fixed by a factor of twice the threshold voltage $V_{th}$. When the input signal escalates to the range of −6 dB to −3 dB, the old dithering method generates a lower SNDR which is not good. The dithering technique in accordance with the present invention, however, produces a signal having a higher SNDR. For a second order modulator, no stability problem exists from extensive simulations. For a higher order system, stability must be checked more carefully.

Those of skill in the art will recognize that although the dither is depicted and simulated for a second order modulator with 3-level quantizer, the new dither method can be easily applied to modulators that have quantizers with more than three levels. In addition the physical location of the elements illustrated in FIG. 4 can be moved or relocated while retaining the function described above. For example, the location of the adders, 142 and 146, may be shifted to add the dithering sequence to the non-inverted input of comparators, 144 and 148.

Advantages of this design include but are not limited to a sigma-delta modulator having a more efficient dithering method that removes idle channel noise. The sigma-delta modulator in accordance with the present invention provides a dynamic, variable window for elimination of idle channel tones. The dither is added by stretching the thresholds window randomly. The randomly stretched window destructs the periodicity of sigma-delta ADC modulator's output sequence thus removes the idle channel tones. Comparing with the conventional dither that adds random noise to the input of the quantizer, the new dither has a higher allowed input dynamic range and higher signal-to-noise-plus-distortion-ratio (SNDR).

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A quantizer circuit, having an analog input terminal, a first threshold input, a second threshold input, and an output terminal, comprising:
   an first adder coupled to receive the first threshold;
   a first dither signal generator having an output coupled to the first adder, wherein the first adder adds the first threshold to the first dither signal;
   a first comparator, having a first and second input, the first input coupled to receive the input signal from the analog input terminal, the second input coupled to the output of the first adder to receive the sum generated by the first adder;
   an second adder coupled to receive the second threshold;
   a second dither signal generator having an output coupled to the second adder, wherein the second adder subtracts the second dither signal from the second threshold; and
   a second comparator, having a first and a second input, the first input coupled to receive the input signal from the analog input terminal, the second input coupled to the output of the second adder to receive the result generated by the second adder.

2. The quantizer circuit as recited in claim 1, wherein the first dither signal generator generates a dither signal having pseudorandom fluctuations in amplitude, and a magnitude that varies inversely to the magnitude of the input signal.

3. The quantizer circuit as recited in claim 1, wherein the second dither signal generator generates a dither signal having pseudorandom fluctuations in amplitude, and a magnitude that varies inversely to the magnitude of the input signal.

4. A sigma delta modulator, comprising:
   a first adder coupled to receive an input signal;
   a feed forward Z transfer function G(z) coupled to the adder;
   a quantizer circuit coupled to the feed forward Z transfer function G(z), the quantizer circuit, having an analog input terminal, a first threshold input, a second threshold input, and an output terminal, the quantizer circuit comprises,
      a second adder coupled to receive the first threshold,
      a first dither signal generator having an output coupled to the second adder, wherein the second adder adds the first threshold to the first dither signal, a first comparator, having a first and second input, the first input coupled to receive the input signal from the analog input terminal, the second input coupled to the output of the second adder to receive the sum generated by the first second, an third adder coupled to receive the second threshold, a second dither signal generator having an output coupled to the third adder, wherein the third adder subtracts the second dither signal from the second threshold, and a second comparator, having a first and a second input, the first input coupled to receive the input signal from the analog input terminal, the second input coupled to the output of the third adder to receive the result generated by the third adder; and a feedback transfer function H(z) coupled to the output terminal of the quantizer circuit.

5. The quantizer circuit as recited in claim 4, wherein the first dither signal generator generates a dither signal having pseudorandom fluctuations in amplitude, and a magnitude that varies inversely to the magnitude of the input signal.

6. The quantizer circuit as recited in claim 4, wherein the second dither signal generator generates a dither signal having pseudorandom fluctuations in amplitude, and a magnitude that varies inversely to the magnitude of the input signal.

7. A method for operating a quantizer, comprising steps of:

sampling an input signal to provide a sampled input voltage signal;

adding a dither current signal to a first threshold voltage to generate a dithered first threshold signal;

subtracting the dither current signal from a second threshold voltage to generate a dithered second threshold signal;

comparing the sampled input voltage signal with the first threshold signal using a first comparator stage to provide a first quantizer output; and comparing the sampled input voltage signal with the second threshold signal using a second comparator stage to provide a second quantizer output.

8. The quantizer circuit as recited in claim 7, wherein the step of adding the dither current signal to the first threshold voltage comprises a step of generating the dither signal to have pseudorandom fluctuations in amplitude, and a magnitude that varies inversely to the magnitude of the input signal.

9. The quantizer circuit as recited in claim 7, wherein the step of subtracting the dither current signal from the second threshold voltage comprises a step of generating the dither signal to have pseudorandom fluctuations in amplitude, and a magnitude that varies inversely to the magnitude of the input signal.

* * * * *